(12) United States Patent  
Brown

(10) Patent No.: US 6,901,490 B2  
(45) Date of Patent: May 31, 2005

(54) READ/MODIFY/WRITE REGISTERS

(75) Inventor: Ray Brown, Bracknell (GB)

(73) Assignee: LSI Logic Corporation, Milpitas, CA (US)

(*) Notice: Subject to any disclaimer, the term of this patent is extended or adjusted under 35 U.S.C. 154(b) by 311 days.

(21) Appl. No.: 10/307,625

(22) Filed: Dec. 2, 2002

(65) Prior Publication Data

US 2004/0107330 A1 Jun. 3, 2004

(51) Int. Cl.[7] .......................... G11C 7/00; G06F 12/00
(52) U.S. Cl. ..................... 711/155; 711/109; 412/5; 412/300; 365/189.01
(58) Field of Search ................. 711/109, 155; 712/5, 300; 365/189.01

(56) References Cited

U.S. PATENT DOCUMENTS 5,408,673 A * 4/1995 Childers et al. ............ 711/149

5,937,178 A * 8/1999 Bluhm ........................ 712/218

\* cited by examiner

Primary Examiner—Jack A. Lane
(74) Attorney, Agent, or Firm—Christopher P. Maiorana, P.C.

(57) ABSTRACT

The present invention may provide a digital memory circuit comprising a plurality of multi-bit registers, a memory circuit interface, and a logic circuit. The memory circuit interface may be configured to access a selected one of the registers. The logic circuit may be coupled to the plurality of multi-bit registers and responsive to data received through the interface for selectively writing a predetermined logic state to at least one first bit of the selected register while leaving at least one second bit in the selected register with an unmodified state.

20 Claims, 4 Drawing Sheets

READ/MODIFY/WRITE REGISTERS

FIELD OF THE INVENTION

The present invention may relate to a digital memory circuit including registers in which a bit may be individually addressable, for example, to be set, cleared (reset) or otherwise modified, without affecting the values of other bits in the same register. Such a register may be referred to herein as a read/modify/write (RMW) register, or as a bit addressable register. The present invention may be especially suitable for use in an integrated circuit, but it is not limited to such an implementation.

BACKGROUND OF THE INVENTION

RMW registers are registers with internal logic circuitry useable to provide a convenient way of directly changing the state of one or more bits in the register without affecting the other bits in the register. Data can be written directly to the register in one of various operating modes including: (i) an overwrite mode in which existing bit values are overwritten; (ii) a set mode in which selected bits are set while other bits are left unchanged, according to the data written; and (iii) a clear mode in which selected bits are cleared (reset) while leaving other bits unchanged, according to the data written. RMW registers find use in processor controlled systems, especially, module resets, interrupt enables, power enables, and input/output interfaces, providing bit-addressable modification (set/clear) functionality at the register to reduce processing burden at the processor, and to reduce traffic on shared busses.

A conventional RMW register includes dedicated logic circuitry for implementing the bit-modification functionality internally within the register. However, such logic circuitry increases the physical size of the register significantly. Where multiple RMW registers are used in an integrated circuit, a large amount of die area is consumed. Especially, when compared to the area occupied for simpler registers without built in bit-modification functionality.

SUMMARY OF THE INVENTION

The present invention may provide a digital memory circuit comprising a plurality of multi-bit registers, a memory circuit interface, and a logic circuit. The memory circuit interface may be configured to access a selected one of the registers. The logic circuit may be common to the plurality of multi-bit registers and may be responsive to data received through the memory circuit interface to writing a new bit value to at least one first bit of the selected register while leaving at least one second bit in the selected register with an unmodified state.

Advantages, features and objects of the present invention may include: (i) enabling RMW functionality to be implemented for multiple registers without each register having internal bit-modification circuitry and/or (ii) reducing the amount of die area occupied by multiple registers while still providing RMW bit-modification functionality for the multiple registers. Other advantages, features and objects of the invention will be apparent from the following description, claims and/or drawings.

BRIEF DESCRIPTION OF THE DRAWINGS

A non-limiting preferred embodiment of the invention is now described, by way of example only, with reference to the appended claims and accompanying drawings, in which:

DETAILED DESCRIPTION OF PREFERRED EMBODIMENT

Figure 1:
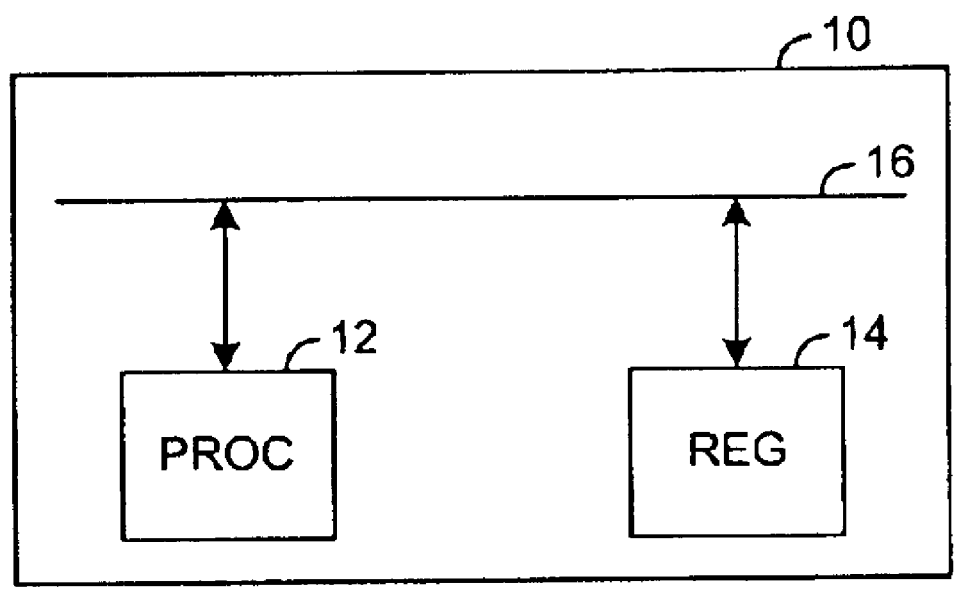
FIG. 1 is a schematic block diagram of an integrated circuit.

Referring to FIG. 1, an integrated circuit 10 is shown in accordance with a preferred embodiment of the present invention. The circuit 10 may include a processor core 12 coupled by a bus 16 to a digital memory circuit 14. The circuit 14 may be implemented as a read/modify/write (RMW) register bank. The bus 16 may be a shared bus which may also be coupled to other functional parts (not shown) of the integrated circuit 10. For example, the bus 16 may be coupled to other memory circuitry (not shown), external interface circuitry (not shown), signal processing circuitry (not shown), etc. The bus 16 may be implemented as (i) an asynchronous bus in which there may be no clock, (ii) a synchronous bus where information may be transferred in time with a clock or (iii) a synchronous pipelined bus where multiple transactions may overlap to make use of internal latencies. The RMW register bank 14 may permit one or more individual bits of an addressed register in the register bank 14 to be set to a new value by a modify (or bit-modify) operation. The modify operation may comprise setting a bit value to a predetermined value, toggling the bit value, or any other operation on the bit value to meet the design criteria of a particular application.

Figure 2:
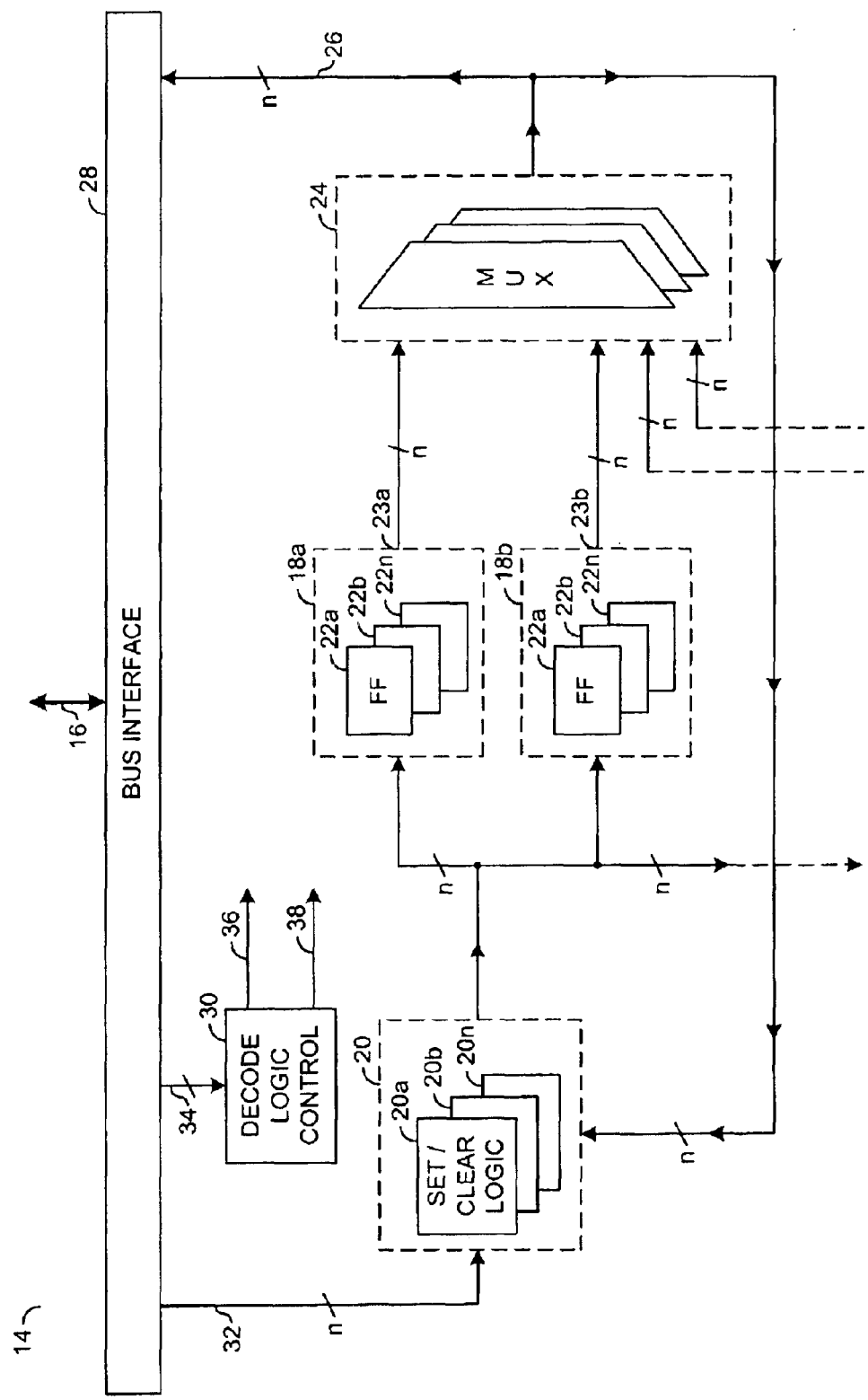
FIG. 2 is a more detailed schematic block diagram of the register bank of FIG. 1.

Referring to FIG. 2, a more detailed block diagram of the RMW register bank 14 of FIG. 1 is shown. The RMW register bank 14 generally comprises a plurality of multi-bit registers 18 (only two registers 18a and 18b being shown for the sake of illustration), bit-modification logic 20, a bus interface (or memory circuit interface) 28 communicating with the bus 16, and decode/control logic 30. The bit-modification logic 20 may be coupled to each of the plurality of registers 18 in the bank 14. The bit-modification logic 20 may be configured to selectively write a predetermined logic value (e.g., 1 or 0) to at least one bit of a register 18 while leaving a state of at least one other bit of the register 18 unchanged. The predetermined logic value may be, in one example, a logic-1 for a "set" operation or a logic-0 for a "clear" operation. The bit-modification logic may also be configured to selectively modify at least one bit while leaving the state of at least one other bit unchanged. For example, a bit may be modified by a toggling operation. Each of the registers 18 may be implemented without internal modification (set/clear) circuitry. The bit-modification functionality may be provided for the bank 14 as a whole by the common bit-modification logic 20. The implementation of a common bit-modification logic 20 for the bank 14 may be extremely advantageous (e.g., by enabling each register 18, and hence the register bank 14 as a whole, to be generally more compact than conventional RMW registers in which each register includes its own dedicated bit-modification logic). Also, since a single register 18 is generally accessed at any one time, the common bit-modification logic 20 may efficiently be coupled to a particular register 18 to be accessed, and may read, modify and write data to the accessed register to implement the bit-modification functionality within the register bank 14, but outside the individual register 18.

Each register 18 may generally comprise a plurality of flip/flops 22, for example, one flip/flop 22 for each bit position in the register 18. Each register 18 may thus comprise "n" flip/flops (22a, 22b, . . . 22n), where "n" is the number of bits in a data word stored in the register 18. An output 23 from each register 18 may be coupled to inputs of an output multiplexer 24. Each output 23 may generally comprise "n" data lines, and the output multiplexer 24 may comprise "n" multiplexer channels (or sub-multiplexers) for providing an n-bit "read" signal 26. The signal 26 may be presented to the bus interface 28. The bit-modification logic 20 may generally be coupled on a data input path 32 from the bus interface 28 to inputs of the registers 18. The data input path 32 may include "n" data lines, and the bit-modification logic 20 may include "n" channels or sub-circuits (20a, 20b, . . . 20n). The bit-modification logic 20 may also receive the n-bit "read" signal 26, for use in performing bit-modification operations, as described in more detail below.

The decode/control logic 30 may receive address data on one or more address lines 34 from the bus interface 28. The decode/control logic 30 may be configured to decode the address data to select a register 18 from the plurality of registers in the bank 14 corresponding to an address received from the bus 16. The registers 18 may be arranged logically or physically in a multi-dimensional array and/or in groups. The address received from the bus 16 may be decoded appropriately to select a particular register 18 from the array and/or group. The decode/control logic 30 may be configured to generate one or more register select signals 36 for enabling the appropriate register 18. The decode/control logic 30 may also generate one or more control signals 38. The control signals 38 may control the registers 18, the output multiplexer 24, the bit-modification logic 20 and the bus interface 28 in accordance with an operating mode of the register bank 14. The register bank 14 may be operable in one or more of the following modes:

(i) A read mode in which data may be read from an addressed register 18 and outputted to the bus 16, without changing the data in the register 18. For example, the addressed register 18 may be enabled by one or more appropriate select signals 36, and the decode/control logic 30 may enable the output multiplexer 24 and the bus interface 28 to present the bit values from the addressed register 18 to the bus 16.

(ii) An overwrite mode in which data received from the bus 16 may be written into an addressed register 18 overwriting the existing data in the register 18. For example, the addressed register 18 may be enabled by one or more appropriate select signals 36, and the decode/control logic 30 may control the set/clear logic 20 to pass the received data, without modification, from the bus interface 28 to the addressed register 18.

(iii) A set mode in which data received from the bus 16 may be used to selectively set at least one "first" bit in an addressed register 18, according to the data, without changing the states of at least one other "second" bit in the register. For example, the addressed register 18 may be enabled by one or more appropriate select signals 36. The decode/control logic 30 may control the output multiplexer 24 to read out the current bit values from the addressed register 18. The bit values may be presented to the bit-modification logic 20. The bus interface 28 may be controlled to block output of the data to the bus 16, where the bus is bidirectional (as otherwise a conflict with data being received on the bus 16 may occur). The decode/control logic 30 may control the bit-modification logic 20 to combine the read-out current bit values with the data received from the bus 16 to perform a set operation. For example, a set operation may be implemented as a logical-OR of the current bit values and the received data. For each bit position, when the received data is a logical-1, the bit may be written (set) as a logical-1 in the register 18 regardless of the current state of that bit in the register 18; when the received data is a logical-0, the current bit state may be preserved (e.g., written back to the register 18 without any change).

(iv) A clear mode in which data received from the bus 16 may be used to selectively clear (e.g., set to zero, or reset) at least one "first" bit in an addressed register 18, according to the data, without changing the states of at least one other "second" bit in the register 18. For example, the addressed register 18 may be enabled by one or more appropriate select signals 36. The decode/control logic 30 may control the output multiplexer 24 to read out the current bit values from the addressed register 18 to the bit-modification logic 20. The bus interface 28 may be controlled to block output of the read out data to the bus 16, where the bus is bidirectional (as otherwise a conflict with data being received on the bus 16 may occur). The decode/control logic 30 may control the bit-modification logic 20 to combine the read-out current bit values with the data received from the bus 16 to perform a clear (reset) operation. For example, a clear operation may be implemented as a logical-AND of the current bit values and an inversion (or complement) of the received data. For each bit position, when the received data is a logical-1, the bit may be written (cleared) as a logical-0 in the register 18, regardless of the current state of the bit in the register 18; when the received data is a logical-0, the current bit state may be preserved (e.g., written back to the register 18 without any change).

(v) A toggle mode in which data received from the bus 16 may be used to selectively toggle or invert the logic state of at least one "first" bit in an addressed register 18, according to the data, without changing the state of at least one other "second" bit in register. For example, the addressed register 18 may be enabled by the one or more appropriate select signals 36. The decode/control logic 30 may control the output multiplexer 24 to read out the current bit values from the addressed register 18 to the bit-modification logic 20. The bus interface 28 may be controlled to block output of the data to the bus 16, where the bus 16 is bi-directional (as otherwise a conflict with data being received on the bus 16 may occur). The decode/control logic 30 may control the bit-modification logic 20 to combine the read-out current bit values with the data received from the bus 16 to perform the toggle operation. For example, the toggle operation may be implemented as a logical-XOR of the current bit values and the received data. For each bit position, when the received data is a logic-1, the current bit state may be inverted (toggled) by the XOR operation, and the inverted state written to the register 18; when the received data is a logic-0, the current bit state may be preserved (e.g., written back to the register 18 without any change).

In the above, the term "first" bits may refer generally to those bits which are forced (e.g., during a set or clear operation) to a certain value irrespective of their previous state or which are modified (e.g., during a toggle operation), and the term "second" bits may refer generally to those bits that retain the current bit value. The terms "first" and "second" are not limited to specific bit positions.

As described above, the bit-modification functionality may be provided by reading the current bit values of a register 18, and providing the current bit values as an input to the bit-modification logic 20 in time for combination with write data received from the bus interface 28. The bit-modification functionality may be provided, in one example, by a loop for cycling the contents of the register 18 through the bit-modification logic 20. The timing of the loop may be controlled such that the current bit values may be read out and presented to the bit-modification logic 20 before the end of a bus cycle for writing data to the register bank 14. Additionally or alternatively, one or more buffers (not shown) may be included for storing the data from the multiplexer 24 until the current bit values are provided to the bit-modification logic 20.

Figure 3:
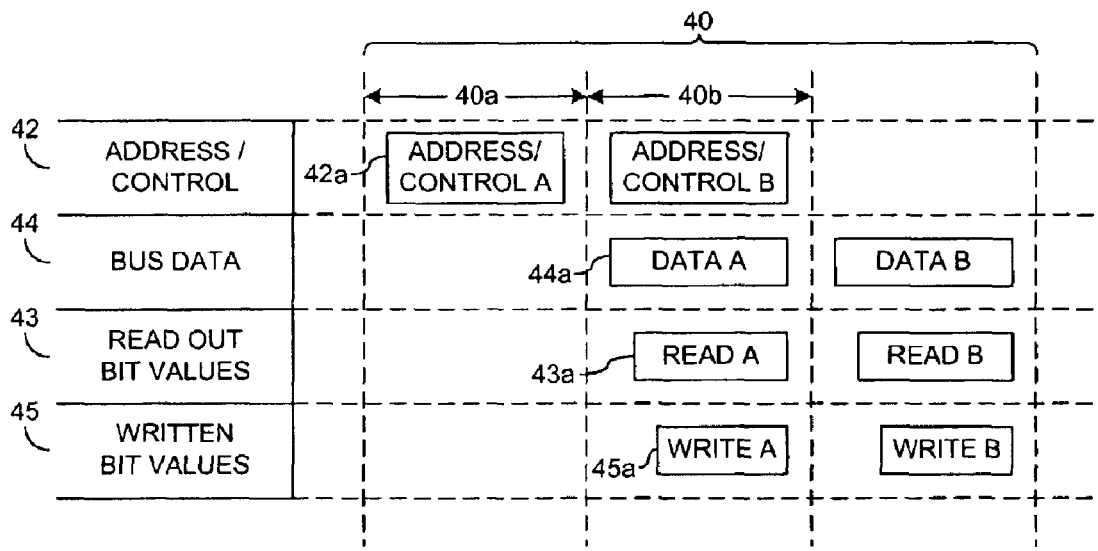
FIG. 3 is a timing diagram illustrating a pipelined bus mode.

As illustrated in FIG. 3, the register bank 14 may be especially useful when the bus 16 is implemented as a pipelined bus. In FIG. 3, bus cycles 40 may be generally represented by intervals. Address and control information 42 may generally precede corresponding data 44 on the bus 16 by one or more bus cycles 40. During a first bus cycle 40a, address and control information 42a may be received from the bus 16 indicating an address of a register 18 and a type of operation. When the operation is a read operation or a modify operation (e.g., a set, clear or toggle operation), current bit values 43 of the addressed register 18 may be read out from the register 18 during a second bus cycle 40b following the first bus cycle 40a. In the case of a read operation, the current bit values 43 may be outputted through the bus interface 28 to the bus 16 in the second bus cycle 40b. In the case of an overwrite or modify operation, incoming data 44a may be received from the bus 16 in the second bus cycle 40b, by which time the current bit values 43 of the register 18 may already be available as an input to the bit-modification logic 20 if needed for a modify operation during the second bus cycle 40b. Modified bit values 45 may be written to the register at the end of the second bus cycle 40b. Therefore, the technique of looping of the current bit-values 43 through the bit-modification logic 20 which may be used in this embodiment to implement the bit-modification functionality, may be especially suitable for the signal timing of a pipelined bus.

Figure 4:
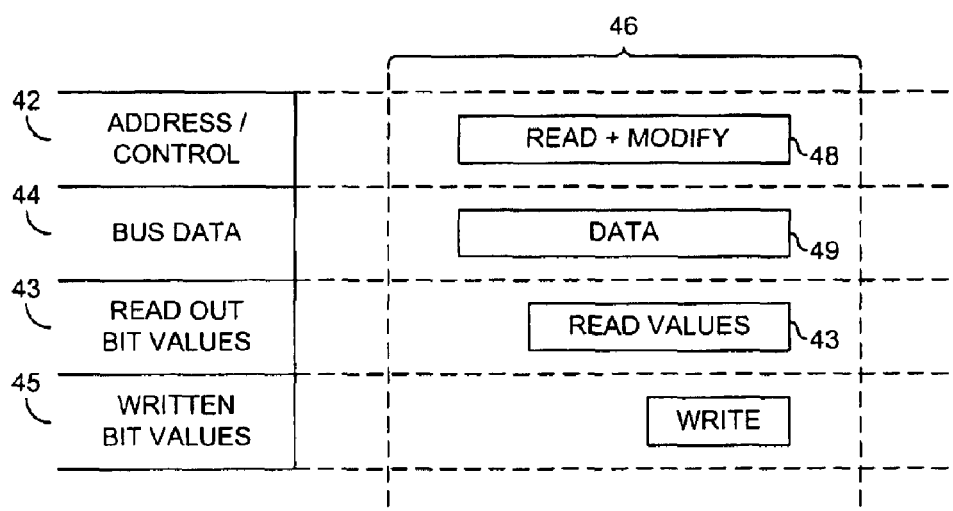
FIG. 4 is a timing diagram illustrating a synchronous bus mode.

Referring to FIG. 4, an alternative addressing technique is shown. The alternative technique may be especially useful when the bus 16 is implemented as an asynchronous bus. The alternative technique may reduce timing constraints in the register bank 14. In an asynchronous bus, address/control information 48 and associated data 49 generally occupy the same bus cycle 46. A "read and modify" operation 48a may be carried out to read current bit values 43 from the register 18. This may facilitate addressing the current bit values 43 prior to the data being needed for a modify part of the operation. The modify part of the operation 48 may be carried out following a first part of the bus cycle 46 by combining at the bit-modification logic 20, the data 49 received from the bus 16 and the bit values 43 already read out during the cycle. This alternative technique may involve a bus cycle 46 that is longer than for a simple write operation. However, even doubling the cycle length, the alternative technique may remain considerably more efficient than the number of bus cycles and processor overhead for performing the same bit-modification functionality at the processor 12.

Figure 5:
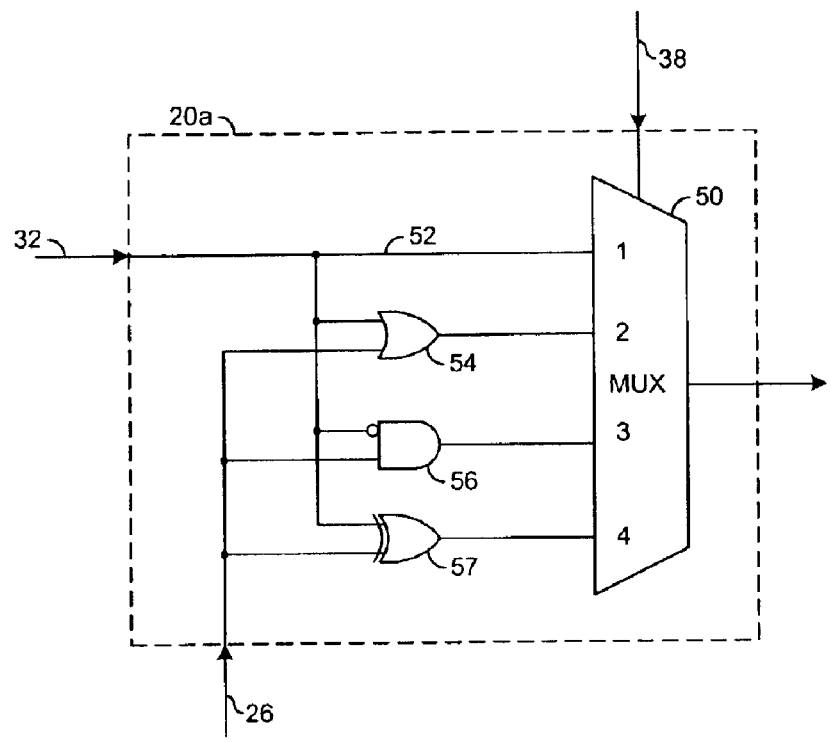
FIG. 5 is a schematic circuit diagram illustrating a first example of the set/clear logic of FIG. 2.
Figure 6:
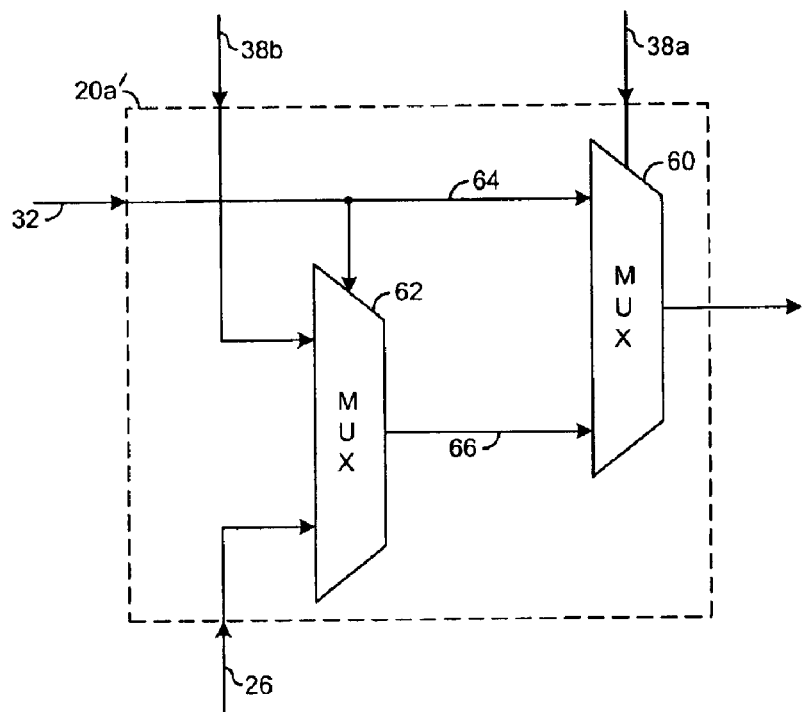
FIG. 6 is a schematic circuit diagram illustrating a second example of the set/clear logic of FIG. 2.

FIGS. 5 and 6 illustrate examples of sub-circuits (for example 20a) of the bit-modification logic 20. In general, a similar circuit may be repeated for each of the "n" bit positions. Portions of the circuits 20a and 20a' may be simplified by omitting portions associated with bit-modification functionality that is not to be implemented.

Referring to FIG. 5, the sub-circuit 20a may generally comprise a four-input multiplexer 50 controlled by a four-way control signal 38 from the decode/control logic 30. A first input to the multiplexer 50 may be provided by a direct signal path 52 for the input signal 32 from the bus interface 28. A second input to the multiplexer may be provided by an OR-gate 54 which may receive as inputs the input signal 32 and the read-out signal 26 from the output multiplexer 24. The OR-gate 54 may perform the logical-OR combination described above for a set operation. A third input to the multiplexer may be provided by an AND-gate 56 which may receive as an inverted input the input signal 32 and as a non-inverted input the read-out signal 26 from the output multiplexer 24. The AND-gate 56 may perform the logical AND combination described above for a clear operation. A fourth input to the multiplexer may be provided by an XOR-gate 57 which may receive as inputs the input signal 32 and the read-out signal 26 from the output multiplexer 24. The XOR-gate 57 may perform the logical XOR combination described above for a toggle operation. The control signal 38 may control the multiplexer 50 to select the first input for an overwrite operation, the second input for a set operation, the third input for a clear operation, and/or the fourth input for a toggle operation.

Referring to FIG. 6, an alternative sub-circuit 20a' is shown. The sub-circuit 20a' may generally implement bit-modification limited to a set/clear functionality. The sub-circuit 20a' may generally comprise a first two-way multiplexer 60 and a second two-way multiplexer 62. For this example, the control signal 38 may comprise two sub-signals 38a and 38b. The signal 38a may have, in one example, a first state indicating an overwrite operation, and a second state indicating a modify operation. The signal 38b may, in one example, distinguish between the modify operation being a set operation or a clear operation. For example, the signal 38b may have a first state (e.g., a logic-1) for a set operation and a second state (e.g., a logic-0) for a clear operation. The first multiplexer 60 may be controlled by the first signal 38a to select either a direct input path 64 for the input signal 32 (e.g., for an overwrite operation), or a modified input signal 66 from the second multiplexer 62 (e.g., for a modify operation). The second multiplexer 62 may provide the modify functionality by selecting between either the read-out signal 26 from the output multiplexer 24, or the signal 38b (which may be a logical-1 for a set operation or a logical-0 for a clear operation). The second multiplexer 62 may be controlled, in one example, by the input signal 32.

Generally, in the circuit of FIG. 2, the overwrite, and modify (e.g., set, clear and/or toggle) modes may be different forms of a general write mode in which data may be written into the addressed register 18. The operating mode of the register bank 14 may be controlled (i) by the decode/control logic 30 in accordance with address data, or (ii) by separate mode control input signals from the bus 16, or (iii) by a combination of both. In one example, a read/write mode signal received from the bus 16 may control whether data is to be outputted to the bus 16 (in response to a "read" control signal), or received from the bus 16 (in response to a "write" control signal). In the case of a "write" control signal, the particular mode (e.g., overwrite, set, clear or toggle) may be controlled by address mapping. Thus each register 18 may appear multiple times in an address map, having multiple addresses selected from: a first address corresponding to an overwrite operation; a second address corresponding to a set operation; a third address corresponding to a clear operation; and a fourth address corresponding to a toggle operation.

During a modify operation, the above circuits may be configured to treat the data from the bus interface 28 in a first manner, such that a logical-1 indicates a bit position to be modified (e.g., set, cleared or toggled), and a logical-0 indicates a bit position to remain unmodified. However, it will be appreciated that the circuits may be configured treat the data from the bus interface 28 in a second manner such that a logical-1 indicates a bit position to remain unmodified, and a logical-0 indicates a bit position to be modified. Alternatively, the circuit may be configured to interpret the data from the bus interface 28 differently according to a particular modify operation. For example, the data may be treated in the first manner for a set operation and in the second manner for a clear operation. However, other configurations may be implemented accordingly to meet the design criteria of a particular application.

The foregoing description is merely illustrative of a preferred, non-limiting embodiment of the invention, and many modifications and equivalents will occur to the skilled man using the principles of the invention. Accordingly, the appended claims are intended to be construed broadly to cover all such modifications and equivalents.

What is claimed is:

1. A digital memory circuit comprising:
   a plurality of multi-bit registers;
   a memory circuit interface for accessing a selected one of said registers;
   a logic circuit coupled to said plurality of multi-bit registers and responsive to data received through said memory circuit interface for writing a new bit value to at least one first bit of said selected register while leaving at least one second bit in said selected register with an unmodified value.

2. A digital memory circuit according to claim 1, wherein said logic circuit comprises internal bit-modification circuitry.

3. A digital memory circuit according to claim 1, wherein said logic circuit is coupled between said multi-bit registers and said memory circuit interface.

4. A digital memory circuit according to claim 3, wherein said logic circuit is coupled to (i) an output of said multi-bit registers for receiving current bit values from said selected register, and (ii) an input of said multi-bit registers for writing bit values including said first and said second bits to said selected register.

5. A digital memory circuit according to claim 1, wherein said logic circuit is coupled in a loop between an output of said multi-bit registers for receiving current bit-values from said selected register, and an input of said multi-bit registers for writing bit values including said first and said second bits to said selected register.

6. A digital memory circuit according to claim 1, further comprising decoder circuitry for decoding an address to access said selected register.

7. A digital memory circuit according to claim 1, wherein said logic circuit is responsive to data received through said memory circuit interface, to set said first bit value to a predetermined state independent of a previous state of said first bit value.

8. A digital memory circuit according to claim 1, wherein said logic circuit is configured to provide at least two operating modes selected from:

a first operating mode in which said logic circuit is configured to overwrite bit values in said selected register in accordance with data received through said interface;
a second operating mode in which said logic circuit is configured to set said at least one first bit to a logic-1 in accordance with data received through said interface;
a third operating mode in which said logic circuit is configured to clear said at least one first bit to a logic-0 in accordance with data received through said interface; and
a fourth operating mode in which said logic circuit is configured to invert said at least one first bit in accordance with data received through said interface.

9. A digital memory circuit according to claim 8, wherein said logic circuit is configured to provide at least three of said first operating mode, said second operating mode, said third operating mode and said fourth operating mode.

10. A digital memory circuit according to claim 1, wherein said logic circuit comprises at least two data paths selected from:
    a first data path in which data received from said interface is unmodified;
    a second data path in which a bit value from said selected register is set to logic-1 or is unmodified, in response to data received from said interface;
    a third data path in which a bit value from said selected register is cleared to logic-0 or is unmodified, in response to data received from said interface; and
    a fourth data path in which a bit value from said selected register is inverted or is unmodified, in response to data received from said interface.

11. A digital memory circuit according to claim 10, wherein said logic circuit further comprises a multiplexer for selecting a signal from said at least two data paths.

12. A digital memory circuit according to claim 10, wherein said logic circuit comprises at least three of said first data path, said second data path, said third data path, and said fourth data path.

13. A digital memory circuit according to claim 10, wherein said memory circuit interface is configured to be operable in an asynchronous mode.

14. A digital memory circuit according to claim 1, implemented in an integrated circuit.

15. An integrated circuit comprising:
    a processor;
    a bus coupled to said processor;
    a digital memory circuit, coupled to said bus and comprising:
        a plurality of multi-bit registers; and
        a logic circuit coupled to said plurality of multi-bit registers and responsive to data received through from said bus to write a new bit value to at least one first bit of a selected one of said multi-bit registers while leaving at least one second bit in said selected multi-bit register with an unmodified state.

16. An integrated circuit according to claim 15, wherein said logic circuit is coupled in a loop between (i) an output of said multi-bit registers for receiving current bit-values from said selected multi-bit register and (ii) an input of said multi-bit registers for writing bit-values including said first and said second bits to said selected multi-bit register.

17. A method of operation in a digital memory circuit comprising a plurality of multi-bit registers, a memory circuit interface, and logic circuitry coupled between said registers and said interface, said method comprising the steps of:

(A) receiving data from said memory circuit interface;

(B) transferring current bit-values from a selected register to said logic circuitry;

(C) combining, at said logic circuitry, said received data and said current-bit values to write, in accordance with said received data, a new bit value to at least one first bit position while leaving at least one second bit position with an unmodified bit value; and (D) transferring said bit-values from said logic circuitry to said selected register.

18. A method according to claim 17, further comprising controlling said new bit value to be a predetermined value.

19. A method according to claim 18, wherein said step of controlling is responsive to said received data.

20. A digital memory circuit comprising:

means for storing a plurality of multi-bit values;

means for accessing a selected multi-bit value from said plurality of multi-bit values;

means for modifying a bit value coupled between said storage means and said accessing means, wherein a selected one of said multi-bit values is combined with data received from a bus, to selectively write a new bit value to at least one first bit from said selected multi-bit value while leaving at least one second bit from said selected multi-bit value with an unmodified state.

* * * * *